US00RE34495E

United States Patent [19]

Sano et al.

[11] E Patent Number: Re. 34,495

[45] Reissued Date of Patent: Jan. 4, 1994

[54] NMR IMAGING METHOD

[75] Inventors: Koichi Sano, Yokohama; Tetsuo Yokoyama, Tokyo; Ryuzaburo Takeda, Mito; Yasuhiko Ozawa, Katsuta; Shinichi Sato, Yokohama; Hideaki Koizumi, Katsuta, all of Japan

[73] Assignee: Hitachi, Ltd., Tokyo, Japan

[21] Appl. No.: 725,514

[22] Filed: Jul. 3, 1991

Related U.S. Patent Documents

Reissue of:

[64] Patent No.: 4,844,077
Issued: Jul. 4, 1989
Appl. No.: 170,695
Filed: Mar. 14, 1988

U.S. Applications:

[63] Continuation of Ser. No. 881,405, Jul. 2, 1986, abandoned.

[30] Foreign Application Priority Data

Jul. 10, 1985 [JP] Japan ..... 60-150194
Nov. 8, 1985 [JP] Japan ..... 60-248810

[51] Int. Cl.[5] ..... A61B 5/055

[52] U.S. Cl. ..... 128/653.3; 324/306; 324/309

[58] Field of Search ..... 128/653.2, 653.3; 324/306, 307, 309

[56] References Cited

U.S. PATENT DOCUMENTS

| | | | |
|---|---|---|---|
| 4,384,255 | 5/1983 | Young et al. | 324/309 |
| 4,451,788 | 5/1984 | Edelstein et al. | 324/309 |
| 4,516,582 | 5/1985 | Redington | 128/653 |
| 4,532,473 | 7/1985 | Wehrli | 324/306 |
| 4,595,879 | 6/1986 | Lent et al. | 324/309 |
| 4,683,431 | 7/1987 | Pattany et al. | 128/653 X |

*Primary Examiner*—Ruth S. Smith
*Attorney, Agent, or Firm*—Antonelli, Terry, Stout & Kraus

[57] ABSTRACT

A slice selection gradient magnetic field used in a pulse sequence for generating a spin echo signal is applied in such a fashion that its polarity at the time of a 90° pulse becomes opposite to the one at the time of 180° pulse, in order to expand a dynamic range of blood flow speed measurement. When the blood flow speed contains a component in a slice vertical direction, the gradient magnetic field in the slice vertical direction is adjusted so that the phase changes of two sets of flow encoded pulses contained in the slice vertical direction are opposite to each other.

The flow speed in the direction of the readout gradient magnetic field, which is a lateral direction of the slice plane, is purely measured by canceling influences of the flow in the slice vertical direction.

17 Claims, 8 Drawing Sheets

NMR IMAGING METHOD

Matter enclosed in heavy brackets [ ] appears in the original patent but forms no part of this reissue specification; matter printed in italics indicates the additions made by reissue.

This application is a continuation of application Ser. No. 881,405, filed July 2, 1986, now abandoned.

BACKGROUND OF THE INVENTION

1. Field of the Invention

This invention relates generally to tomography utilizing a nuclear magnetic resonance (NMR) phenomenon, and more particularly to a technique of imaging a blood flow inside a body.

2. Description of the Prior Art

The principle of blood flow imaging lies in that a gradient magnetic field which does not exert any influences upon a stationary object but does only upon a moving object is applied in a flow direction and measures a flow speed by adding phase information that varies in accordance with the flow speed. FIG. 1 of the accompanying drawings illustrates this principle. It will now be assumed that a blood flow flows through a blood vesel 11 in a Z direction. A gradient field 12 ($G_z$) is applied at a time $\tau_1$ and an inversion gradient field 13 ($-G_z$) is applied at a time $\tau_2$ after $\Delta\tau$ from the time $\tau_1$. The inversion gradient field has the same magnitude as the gradient field ($G_Z$) but its polarity is opposite. It is called a bi-polar gradient.

Since a stationary object does not have any motion, it feels the magnetic fields that have the same magnitude but reversed polarities at the time $\tau_1$ and $\tau_2$, and the influences of these fields are cancelled with each other so that the state at this time is exactly the same as the state where no gradient field is applied at all. On the other hand, since a blood flow portion has motion, it feels different fields at the time $\tau_1$ and $\tau_2$, and the influences of these fields are not cancelled but provide a phase change to spin.

The following relation is established between the phase and the flow speed with $t_P$ and $t_I$ representing time and interval of the bi-polar gradient field, respectively:

$$\theta = 0.36\nu_0 V G_Z t_P t_I \quad (1)$$

where $\theta$: phase rotation angle (degree) due to flow speed, $\nu_0$: resonance frequency (4.258 KHz/G), V: flow speed (cm/sec), $G_Z$: gradient of gradient field (G/cm), $t_P$: time of bi-polar gradient field (msec), $t_I$: interval of bi-polar gradient field (msec).

In other words, the phase angle is proportional to the flow speed V, the time $t_P$ of the gradient field and the interval of the gradient field. Since $t_I$ and $t_P$ are constant at the time of imaging, the phase angle is after all proportional to the flow speed and its value can be set arbitrarily by controlling $t_P$ and $t_I$. A sequence that provides phase information to motion by the combination of two gradient fields having such $t_I$ and $t_P$ is referred to as a "flow encoded pulse".

Conventionally, imaging has been effected by adding this flow encoded pulse to an ordinary sequence. In this case, thephase changes due to the following factors in addition to the flow encoded pulse:

(1) phase change resulting from distortion of the apparatus such as distortion of a stationary magnetic field; and (2) phase change due to the influences of a slice selection gradient field, which functions equivalently to the flow encoded pulse contained in the ordinary sequence, and of a read-out gradient field (they affect only a moving object).

The flow speed cannot be measured accurately unless these phase change components are removed. Therefore, it has been customary in the art to effect imaging in the ordinary sequence with the addition of the flow encoded pulse and then to measure the flow speed from the phase of its difference.

In the case of the phase, however, the method based upon the difference described above involves the following problems. Namely, since the phase has a cyclic value for every $2\pi$, the phase cannot be determined accurately if a phase angle becomes great. This means that a dynamic range of measurement becomes narrow. Particularly, a critical problem lies in that a portion which is dependent upon the flow speed exists among uncontrollable phase components.

The method relying upon the difference must effect imaging at least twice.

Next, the problems of the prior art technique encountered in blood flow measuring using the flow encoded pulse will be described.

Generally, a slice vertical direction, an image lateral direction as a direction of the read-out gradient field and an image longitudinal direction as the phase encoding direction are referred to as Z direction, x direction and y direction, respectively. Hereinafter, the description will be made by use of these z, x and y directions.

The combination or a set of the two gradient fields described above is referred to as the flow encoded pulse and is always used for the measurement of the blood flow. However, its influence varies depending upon whether the direction of the blood flow is the z direction or the x direction. The reason will be explained with reference to FIG. 2 showing an imaging pulse sequence.

In the drawing, three kinds of "flow encoded pulses" exist. Namely, two kinds of $G_z$ and one for $G_x$. As to $G_z$, one set of pulses 102 and one set of pulses 105 exist. Though only one pulse 105 is shown in the drawing, a 180° pulse 104 which is applied simultaneously functions substantially in the same way as the pulse 105. Two phase rotations occur due to the gradient fields by the pulses 102 and 105 on the basis of the principle described above.

The pulses 103 and 107 are the flow encoded pulses for $G_x$. Unlike the z direction, the field is a gradient field during the read-out operation of a measuring signal 108. Therefore, the blood flow in the x direction changes the frequency during the measurement. Though individual spins exhibit complicated behaviours, the phase rotation proportional to the flow speed occurs in the same way as in the z direction.

The following methods have conventionally been reported as to the measurement of the blood flow in the x direction. The first method is described in "Phase Encoded NMR Flow Imaging" by D. G. Norris, pages 559–560 proceeding published by Society of Magnetic Resonance in Medicine, third annual meetings, 1984. A flow encoding is added in the same way as in the z direction at times other than at the time of measurement. Imaging is effected eight times while changing the conditions and an image of speed resolution of eight points can be obtained by Fourier Transform in that direction.

The second method is described in "NMR Velocity Imaging by Phase Display" by V. J. Wedeen, pp. 742–743, proceedings published by Society of Magnetic Resonance in Medicine, third annual meetings, 1984. This method uses directly the pulses 103 and 107 for $G_x$, but in order to examine the speed change, the position of the pulse 107 is deviated so that the phase changes linearly with respect to the position. Since the phase changes cyclically for every $2\pi$, the resulting image appears as a fringe-like pattern. Though the fringe pattern is a clear longitudinal fringe in the case of a stationary object, it is distorted in accordance with the magnitude of motion of the object if any motion exists. The flow speed can be observed from this as a pattern.

These two methods described above are qualitative imaging methods and hence, involve quantitative problems.

In addition, the number of images taken must be increased in accordance with the first method in order to improve speed resolution, and this is a critical problem in NMR imaging which requires an elongated imaging time. In accordance with the second method, on the other hand, the z direction cannot be distinguished from the x direction if any motion of the object exists in the z direction. For this reason, this method is limited only to the case where the motion exists only inside the y plane, and is not free from a large practical problem.

SUMMARY OF THE INVENTION

It is a first object of the present invention to provide a method of measuring a blood flow speed which eliminates the problems of the conventional blood flow measurement methods based upon the difference, which needs a shorter imaging time and which has a wide dynamic range.

In order to measure the blood flow by single imaging, the phase change resulting from the distortion of the apparatus and the phase change resulting from the influences of the slice selection gradient field, that are described already, must be corrected. The distortion of the apparatus can be corrected by the method described in detail in Japanese Patent Application No. 26241/1985 [field] *filed* by some of the inventors of the present invention and on which copending U.S. patent application Ser. No. 133,069, *now U.S. Pat. No. 4,870,362,* is based.

The problem is how to correct the phase change resulting from the influences of the slice selection gradient field. This is a function of the flow speed. Therefore, the phase change in accordance with the flow speed occurs even when the flow encoded pulse is not applied, and the flow speed can be measured. This method is described in Japanese Patent Applications No. 26241/1985 (U.S. patent application Ser. No. 133,069, *now U.S. Pat. No. 4,870,362,*). In accordance with this method, however, the time of the gradient field is fixed by the sequence. Accordingly, though there is no practical problem where the flow speed is low, when it is high, the phase rotates too much and the flow speed cannot be calculated correctly. In other words, the dynamic range becomes narrow.

In order to solve this problem, the present invention proposes an opposite polarity field applying method. Based upon the fact that in accordance with a spin echo method, the applying of the slice selection gradient field occurs twice, i.e., at the time of a 90° RF pulse and at the time of a 180° RF pulse, the present invention applies a gradient field having exactly the opposite phase at the time of the 90° pulse and the 180° pulse. As a result, the phase rotation is reversed at the time of the 90° pulse and the 180° pulse, and the adverse influence upon the phase rotation due to the motion of the object can be substantially cancelled by adjusting the time of the gradient field at the time of the 180° pulse.

Since the measurement of the blood flow cannot be made as such, the flow encoded pulse is afresh impressed while being controlled so that the measurement can be made in an arbitrary dynamic range.

Alternatively, it is also possible at this time to arbitrarily set the dynamic range by controlling the timing of the inversion gradient field, which must by all means be impressed to correct the variance of the phases in the slicing direction after the 90° pulse, without applying the flow encoded pulse.

It is a second object of the present invention to provide a method of measuring the blood flow speed in the x direction, which method is practical and quantitative.

To accomplish this object, the relation between the blood flow speed in the x direction and the phase angle is determined in the same way as in the measurement of the blood flow speed in the z direction. When the blood flow flows only in the x direction, the blood flow speed can be determined from the phase of the reproduced image. However, the blood flow in the x direction is mostly accompanied by the flow in the z direction (slice vertical direction). Therefore, $G_z$ is set so that the phase changes of the two sets of flow encoded pulses are reversed with respect to each other in view of the fact that the two sets of the flow encoded pulses are contained in the x direction. Accordingly, if $G_z$ is controlled in a satisfactory manner, the phase can be made substantially zero independently of the flow speed in the x direction. If imaging is made in such a sequence, the flow speed in the x direction can be determined from the phase of the reproduced image.

In the sequence shown in FIG. 2, the relation between the flow speed and the phase is as follows when motion exists only in the x direction:

$$\theta=\gamma.G_x.V.t_p.t_f[\text{rad}] \qquad (2)$$

where $\gamma$: nuclear magnetic rotation ratio
$G_x$: gradient of gradient field in x direction
V: flow speed
$t_p$: $G_x$ basic time
$t_f$: $G_x$ interval.

In order to eliminate the phase rotation due to the influences in the z direction, it is possible to apply the ordinary pulse 105 and then to add once again the flow encoded pulse which makes the phase rotation opposite, instead of applying $G_z$ whose polarity is reversed.

Incidentally, the method of the present invention can be applied to organs having motion such as a heart besides the blood vessel.

DESCRIPTION OF THE PREFERRED EMBODIMENTS

Figure 3:
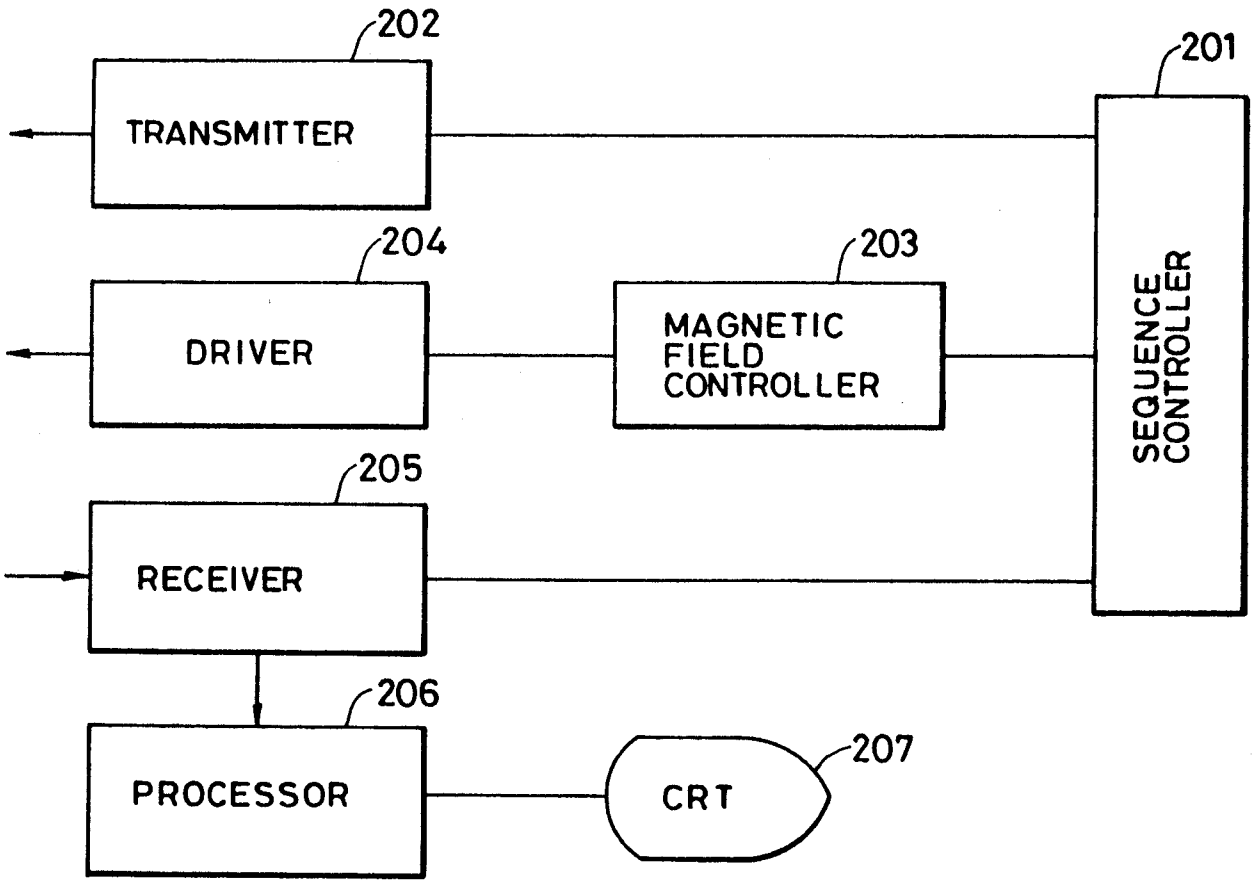
FIG. 3 shows a block digram construction of an NMR imaging apparatus to which the present invention is applied.

FIG. 3 shows a block diagram construction of an NMR imaging apparatus to which the present invention is applied. A sequence controller 201 controls various pulses and magnetic fields generated in order to detect NMR signals from a subject, and controls also a transmitter 202, a magnetic field controller 203 and a receiver 205 each of which has the following function. The transmitter 202 transmits a radio frequency (RF) pulse generated in order to let a specific nuclide of the subject resonate, and the magnetic field controller 203 generates a magnetostatic field for determining the resonance frequency of the NMR signal and gradient fields whose intensity and direction can be controlled arbitrarily. The receiver 205 detects and then measures the NMR signal generated from the subject. A processor 206 reconstructs an image on the basis of the measurement signal received from the receiver 205 and the reconstructed image is displayed on a CRT display 207. A driver 204 generates a magnetic field necessary for measurement on the basis of the control signal outputted from the magnetic field controller 203.

Figure 4:
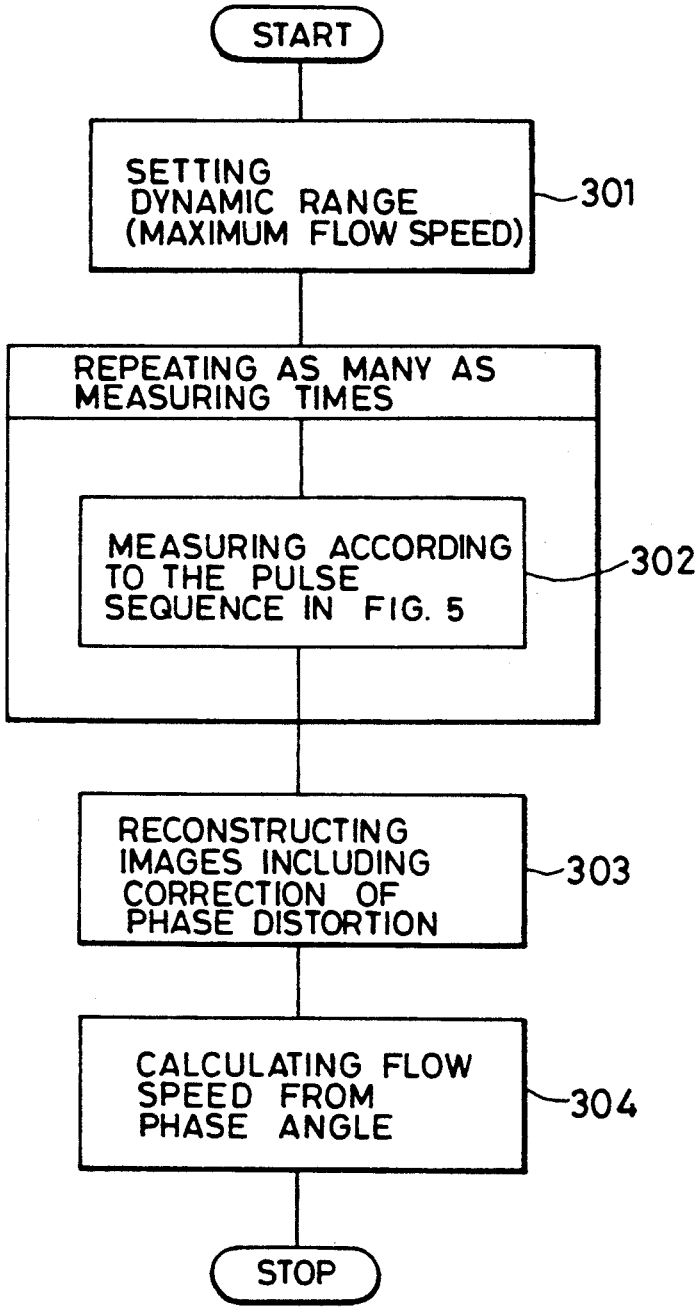
FIG. 4 shows a flowchart of processing sequence in a first embodiment of the present invention.

In the construction described above, the method of the first embodiment of the present invention based on the reverse polarity field applying method will be described with reference to FIGS. 4 and 5. FIG. 4 is a flowchart showing the blood flow imaging process in accordance with the present invention as a whole.

Step 301

Figure 5:
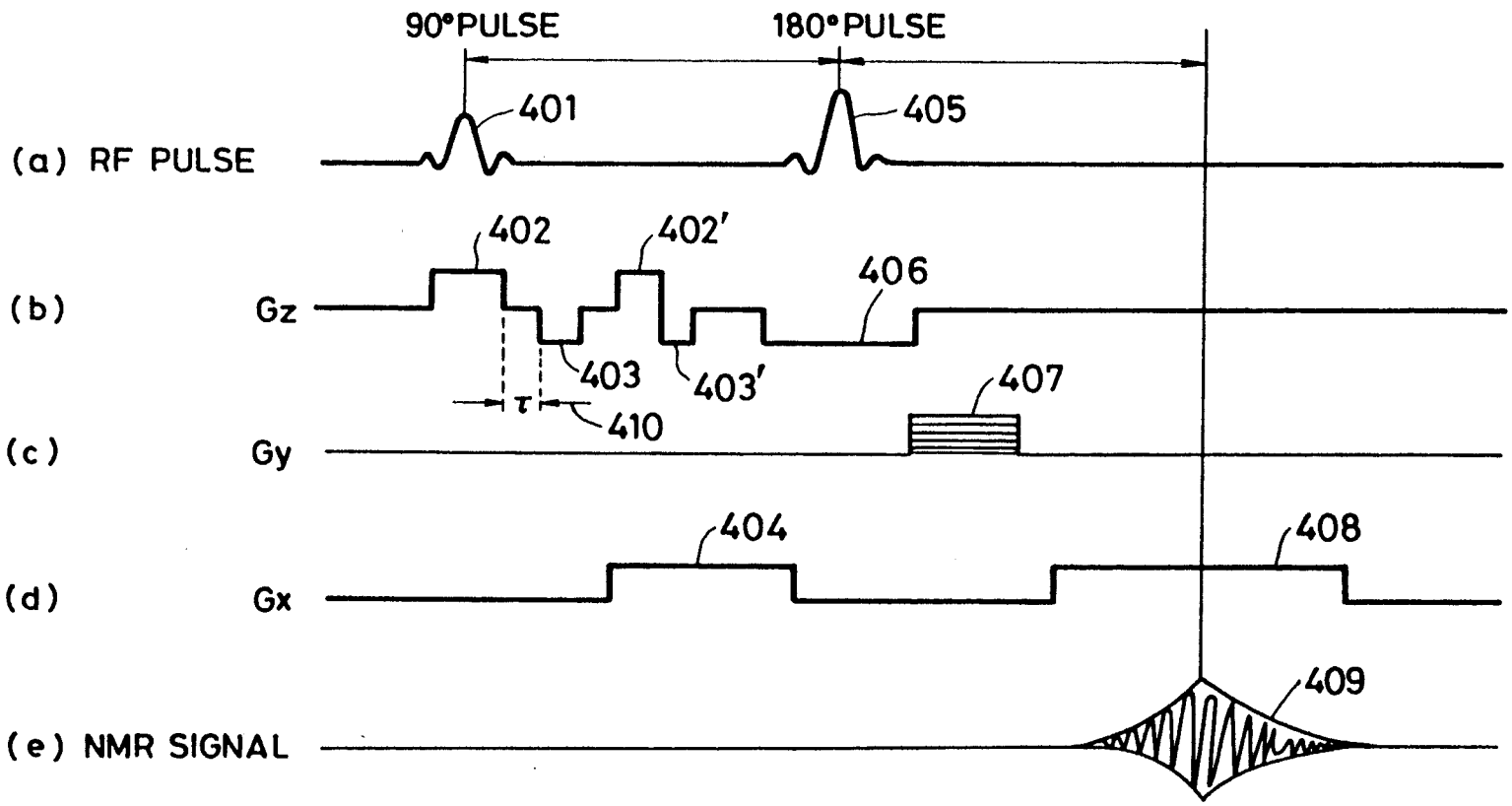
FIG. 5 shows an example of pulse sequence as an imaging sequence in the first embodiment of the present invention.

In the pulse sequence shown in FIG. 5, the time difference 410 between gradient magnetic fields 402 and 403 as a parameter which determines the range of flow speed measurement is set. The relation between the flow speed V and the phase angle is expressed by the following equation where the time difference is $\tau$ msec:

$$\theta = 1.84 \times V \times \tau (\text{degree})$$

Since $\theta$ must be within $\pm 180°$, the parameter is determined as follows with a maximum flow speed being $V_{max}$:

$$\tau = \frac{180}{1.84 \times V_{max}} = \frac{97.8}{V_{max}}$$

When $V_{max} = 100$ cm/sec, for example, $\tau$ is set to 0.98 msec.

Step 302

Tomography is effected in accordance with the pulse sequence shown in FIG. 5 and the NMR signal 409 is measured 256 times. The difference from the ordinary sequence lies in the gradient field 403 ($-G_z$) whose polarity is inverted from that of the gradient field 402 ($G_z$) at the time of application of the 90° pulse 401. The time width of the gradient field 406 is determined independently of the time width of the 180° pulse 504 so that the phase rotation due to the influence of the flow speed becomes zero, when $\tau$ is set to 0 at Step 301. In this case, the time width of the gradient field 406 is determined so that the phase angle change of the NMR signal changing due to the motion of the blood flow or the like at the time of application of the 90° pulse is cancelled and becomes substantially zero when the 180° pulse 405 is applied. This value changes with the time of the inversion gradient field 403, but is about 1.5 times the time of the gradient field 402. The timing of the inversion gradient field 403 may be changed when the 90° pulse 401 is applied. Furthermore, the phase angle proportional to the moving speed of the blood flow or the like can be obtained by adding gradient fields 402' and 403' as shown in FIG. 5(b).

Incidentally, a gradient field $G_x$ in FIG. 5(d) is applied in order to locate the origin of sampling the NMR signal, while a gradient field $G_y$ shown in FIG. 5(c) is applied in order to add phase information in accordance with position.

Step 303

A signal 409 obtained after d.c./a.c. detection is corrected because it is subjected to phase change due to the distortion of the apparatus. The distortions that affect the phase are as follows:

(1) deviation of origin of sampling position of NMR signal;

(2) characteristics of detection system;

(3) non-uniformity of static magnetic field.

These distortions can be corrected by the method disclosed in detail in Japanese Patent Application No. 114082/1985 I (U.S. patent application Ser. No. 133,069, *now U.S. Pat. No. 4,870,362,* or U.S. Pat. No. 4,736,160), for example. Image reconstruction is made while correction of the distortions (1)~(3) described above is being made.

Step 304

The NMR image obtained by the preceding step is a complex signal expressed by the equation below:

$$f(x,y) = f_R(x,y) + if_I(x,y)$$

The phase angle can be calculated from the equation below:

$$\theta(x,y) = \text{sign}(f_I(x,y))\arccos\left[\frac{f_R(x,y)}{\sqrt{f_R^2(x,y)/f_I^2(x,y)}}\right]$$

The flow speed can be calculated from the equation below:

$$V = \frac{\theta}{1.84 \times \tau}$$

where $\tau$ is the value set at Step 301.

Figure 6:
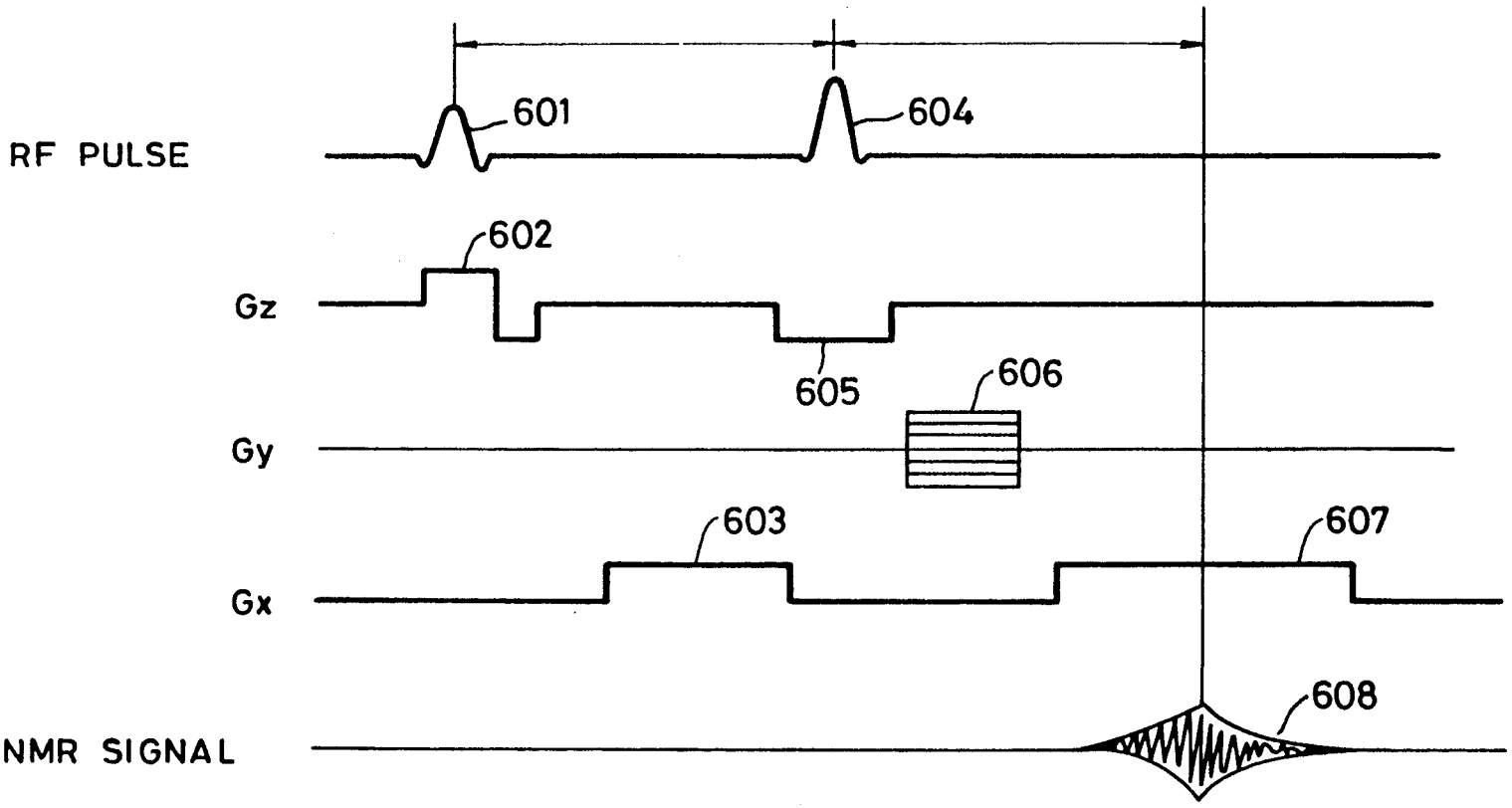
FIG. 6 shows an example of pulse sequence as an imaging sequence in a second embodiment of the present invention.
Figure 7:
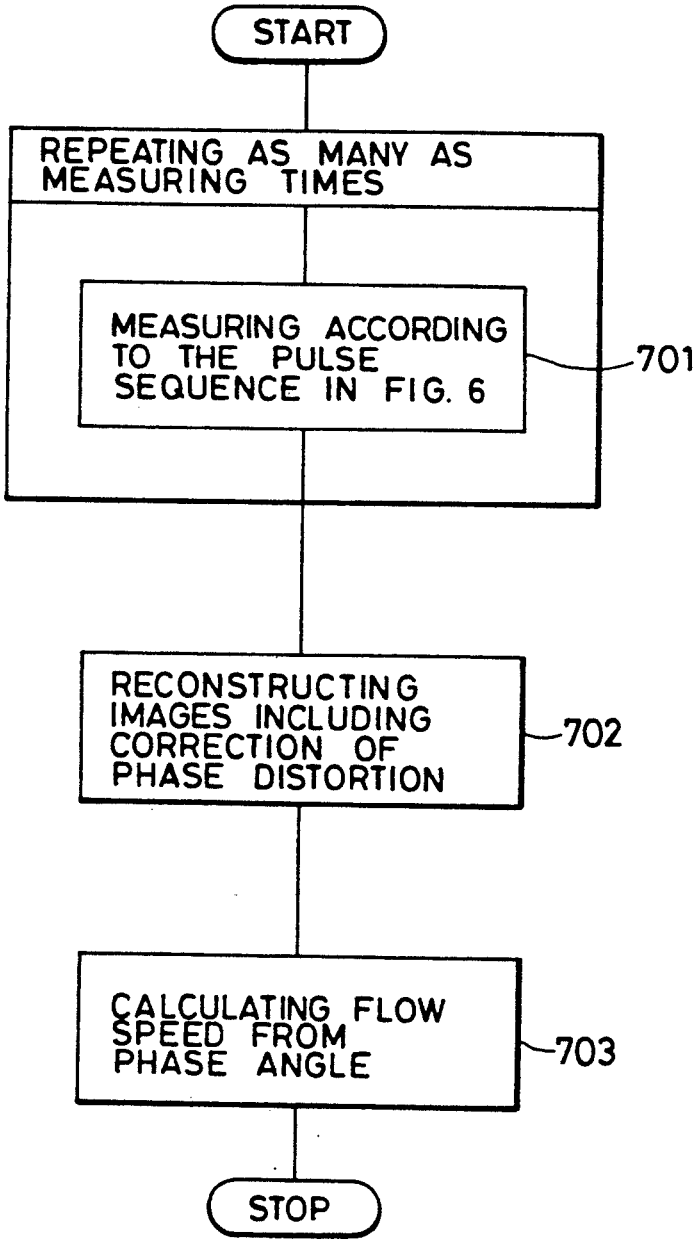
FIG. 7 shows a flowchart of processing sequence of the second embodiment of the present invention.
Figure 8:
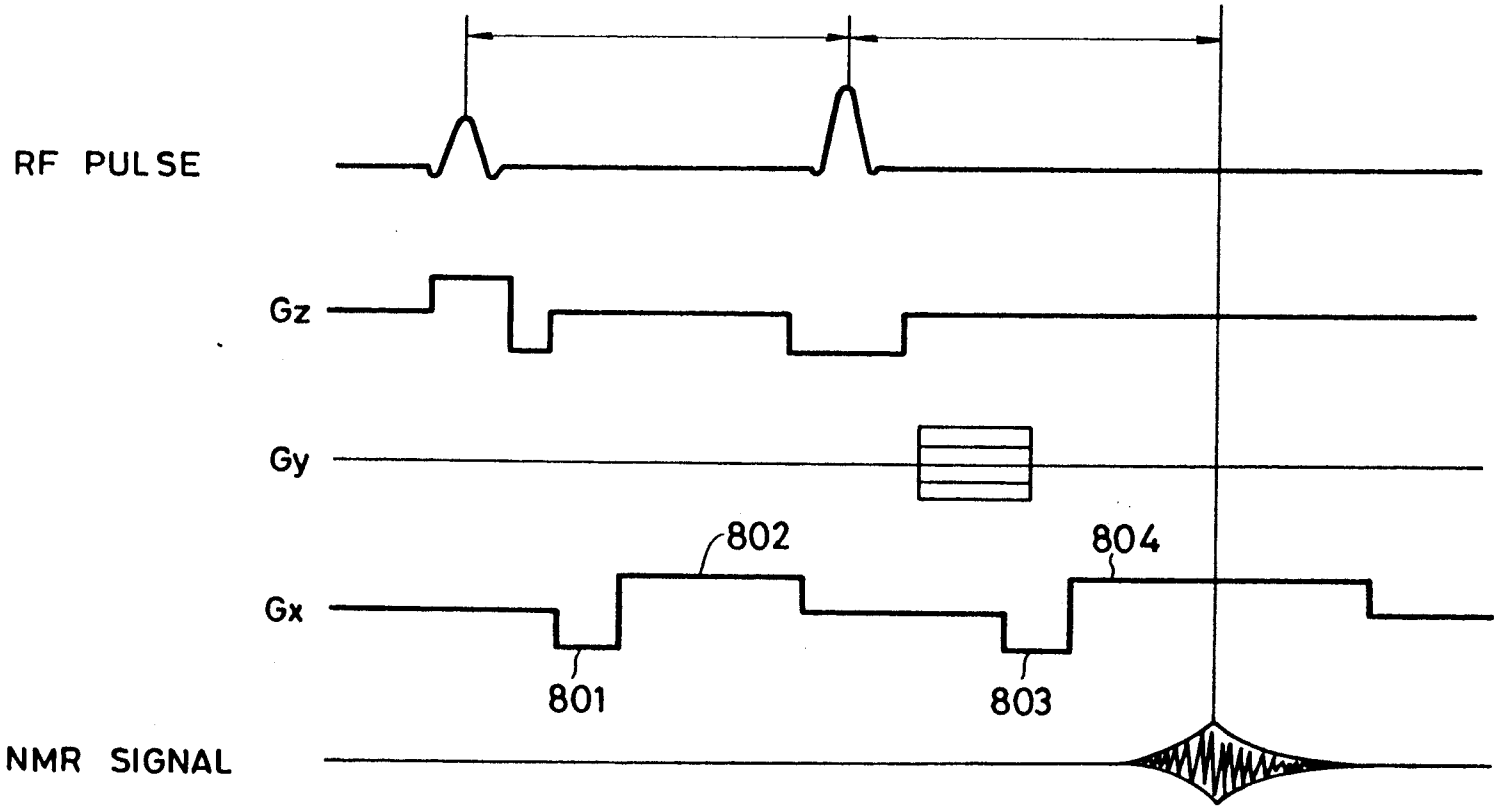
FIG. 8 shows a pulse sequence as an example of imaging sequence for expanding a dynamic range.

The sequence of practicing the second embodiment of the present invention in the construction shown in FIG. 3 will be described with reference to FIGS. 6 to 8. Here, a method of reversing the pulse 105 will be described as a method of cancelling the phase change in the z direction. FIG. 6 shows the pulse sequence used in the second embodiment of the present invention and FIG. 7 is a flowchart of processing using the sequence of FIG. 6. Hereinafter, the description will be made with reference to FIG. 7.

Step 701

Figure 1:
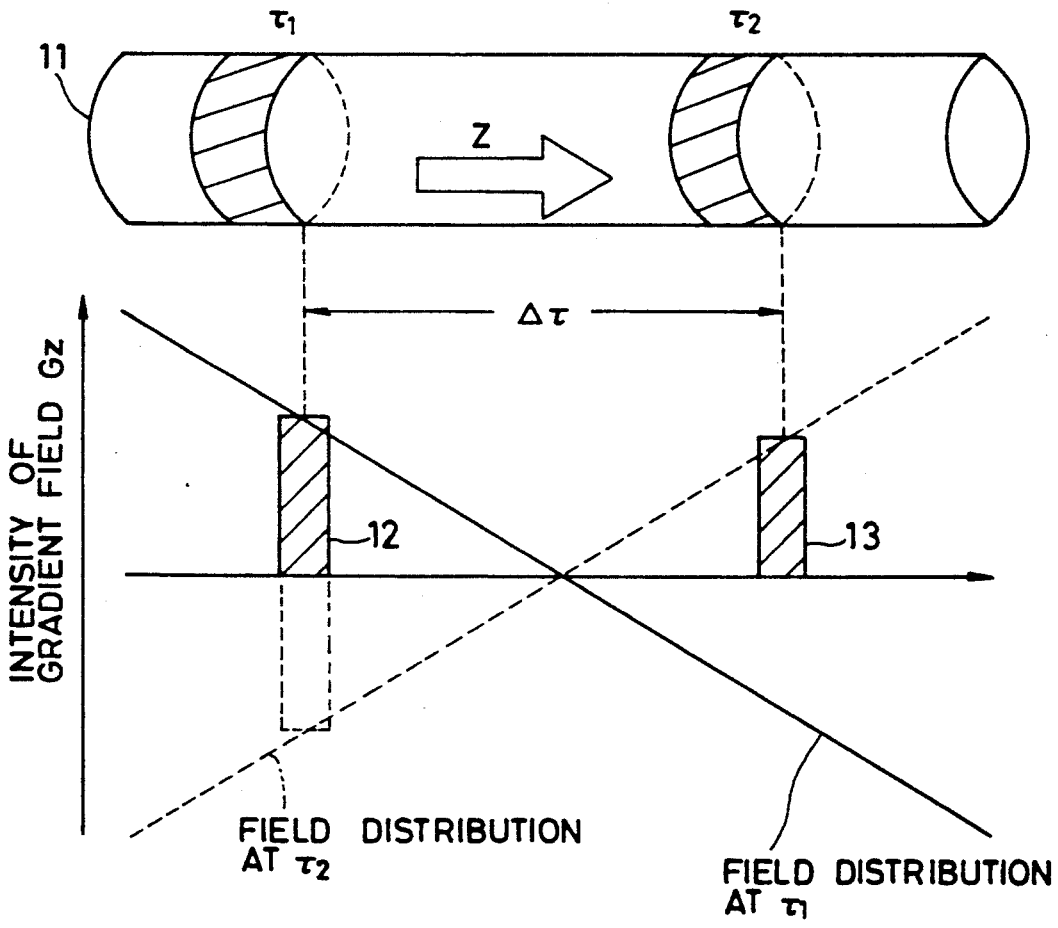
FIG. 1 (PRIOR ART)
FIG. 1 shows the principle of blood flow imaging.
Figure 2:
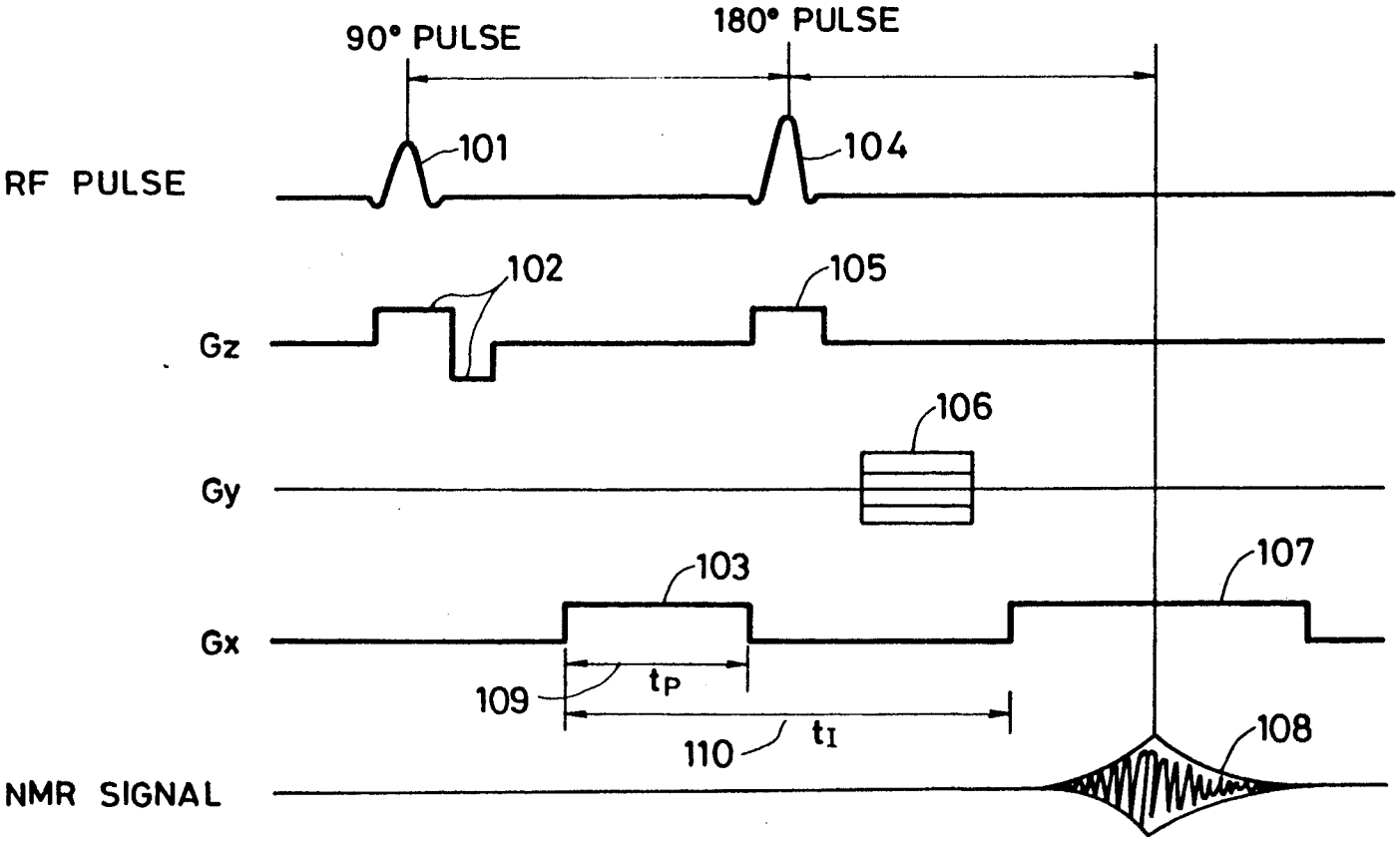
FIG. 2 (PRIOR ART)
FIG. 2 shows the pulse sequence used in ordinary NMR imaging apparatuses.

The phase encoded gradient field ($G_y$) 606 is changed 256 times in accordance with the pulse sequence shown in FIG. 6 in order to effect imaging. The difference of this pulse sequence from the ordinary pulse sequence shown in FIG. 2 lies in the polarity and impression time of the gradient field ($G_z$) 605. Its polarity is inverted from that of the gradient field ($G_z$) 602 so that the phase change of the gradient field ($G_z$) 602 due to the flow speed is exactly opposite to the phase change of the gradient field ($G_z$) 605 due to the flow speed. The phase becomes zero independently of the flow speed in the z direction if the time of the gradient field ($G_z$) 605 is about 1.5 times the RF pulse width 604.

Step 702

The signal 608 obtained after d.c./a.c. detection is corrected because it is subjected to the phase change due to the distortions of the apparatus. The distortions affecting the phase are as follows:

(1) deviation of origin of sampling position of NMR signal;

(2) characteristics of detection system;

(3) non-uniformity of static magnetic field.

These distortions can be corrected by a heretofore known method (Sano et al, "Phase Distortion Correction Technique in NMR Imaging", National Convention Record, 1985 The Institute of Electronics and Communications Engineers of Japan) and as disclosed in U.S. patent application Ser. No. 133,069, *U.S. Pat. No. 4,870,362,* or U.S. Pat. No. 4,736,160. The image is reconstructed while these distortions are being corrected.

Step 703

The NMR image obtained by the preceding step is a complex signal expressed by the following equation:

$$f(x,y)=f_R(x,y)+if_I(x,y)$$

The phase angle can be calculated in accordance with the following equation:

$$\theta(x,y) = \mathrm{sign}(f_I(x,y))\arccos\frac{f_R(x,y)}{\sqrt{f_R^2(x,y)+f_I^2(x,y)}}$$

As described already, this phase angle is independent of the flow speed in the z direction but is proportional to the flow speed in the x direction, and its relational formula is as follows:

$$\theta=G_x\cdot\gamma\cdot V\cdot t_P\cdot t_I$$

where $G_x$: gradient field intensity in x direction $\gamma$: nuclear magnetic rotation ratio $t_P$: impression time of pulse 603

$t_I$: impression interval between pulses 603 and 607.

In this sequence, the $t_P$ value cannot be made smaller than a certain value from the relation with the measurement time. Since the phase angle $\theta$ is within the range of from $-\pi$ to $+\pi$, the maximum flow speed of measurement is hereby limited.

A sequence solving the problem described above is shown in FIG. 8. The difference of this sequence from the sequence shown in FIG. 6 lies in a pulse pair 801 and 803 of ($-G_x$). This pulse pair is the flow encoded pulses and has an opposite polarity to that of the pulse pair 802 and 804 of $G_z$. Therefore, the phase rotation angle due to the flow speed becomes opposite and the phase angle for the same flow speed becomes smaller, thereby making it possible to eventually expand the dynamic range.

A blood vessel portion can be extracted by paying a specific attention to the point at which the phase of a moving portion changes, and then extracting the portion whose phase is deviated from 0°.

In accordance with the present invention, the blood flow speed can be measured by one imaging. Particularly, the present invention can set arbitrarily the dynamic range and makes it possible to measure the blood flow on a section having a wide range of flow speeds.

Furthermore, since only the flow speed component of the blood vessel in the x direction can be purely taken out in an arbitrary direction by one imaging, the present invention is quantitatively excellent and can improve the through-put of measurement.

What is claimed is:

1. A nuclear magnetic resonance (NMR) imaging method utilizing an NMR apparatus comprising the steps of generating a magnetostatic field, a radio frequency (RF) magnetic field, and a gradient magnetic field including a slice selection gradient magnetic field which is applied in different polarities at the time of application of a 90° pulse and the time of application of a 180° pulse, the generated fields being applied to an object to be imaged; detecting by picking up an NMR signal from the object; removing a phase change due to distortion of the apparatus; and calculating including performing calculations for reconstruction of an image, for the signal thus detected.

2. An NMR imaging method according to claim 1, wherein the applying time of said slice selection gradient magnetic field at the applying time of said 180° pulse is determined independently from the applying time of said 180° pulse.

3. An NMR imaging method according to claim 2, wherein the applying time of said slice selection gradient magnetic field at the applying time of said 180° pulse is determined so that the phase angle of the NMR signal at the applying time of said 90° pulse is cancelled and becomes substantially zero at the applying time of said 180° pulse.

4. An NMR imaging method according to claim 3, wherein said slice selection gradient magnetic field includes a gradient field providing a phase angle proportional to the moving speed of the object.

5. An NMR imaging method according to claim 1, wherein the step of generating the gradient magnetic field includes applying an inversion gradient field in succession to said slice selection gradient magnetic field which is applied at an applying time of said 90° pulse, and at a timing which is changed relative to said applying time of said 90° pulse.

6. A nuclear magnetic resonance (NMR) imaging method utilizing an NMR apparatus comprising the steps of generating a magnetostatic field, a radio frequency (RF) magnetic field, and a gradient magnetic field the generated fields being applied to an object to be imaged; detecting by picking up an NMR signal from the object; removing a phase change due to distortion of the apparatus; and calculating including performing calculations for reconstruction of an image for the signal thus detected; wherein the step of generating the gradient magnetic field includes generating the gradient magnetic field in a sequence in a predetermined direction so that a speed component of the object in a direction of read out gradient magnetic field for the detected signal corresponds to a phase angle of the detected signal, and wherein the generated sequence for the gradient magnetic field by which speed is measured is determined by applying a slice selection gradient magnetic field with different polarities at a time of application of a 90° pulse and a time of application of a 180° pulse so that influences upon the phase angle by a motion component of the object in a direction other than the direction of the read out gradient magnetic field can be substantially neglected, whereby the speed component of the object in the direction of the read out gradient magnetic field is correctly determined with one imaging.

7. An NMR imaging method according to claim 6, wherein the gradient magnetic field sequence includes a gradient magnetic field having a polarity opposite to the polarity of the read out gradient magnetic field and which is applied before applying a gradient field in the direction of the read out gradient magnetic field.

8. A nuclear magnetic resonance (NMR) imaging method utilizing an NMR apparatus comprising the steps of generating a magnetostatic field, a radio frequency (RF) magnetic field, and a gradient magnetic field, the generated fields being applied to an object to the imaged; detecting by picking up an NMR signal from the object; removing a phase change due to distortion of the apparatus; and calculating including performing calculations for reconstruction of an image for the signal thus detected; wherein the step of generating the gradient magnetic field includes generating the gradient magnetic field in a sequence ina predetermined direction so that a speed component of the object in a direction of a read out gradient magnetic field for the detected signal corresponds to phase angle of the detected signal, and wherein the generated sequence for the gradient magnetic field by which speed is measured is determined by applying a slice selection gradient magnetic field and a flow encode pulse which makes the phase rotation opposite to the phase rotation generated by the slice selection gradient magnetic field so that influences upon the phase angle by a motion component of the object in a direction other than the direction of the read out gradient magnetic field can be substantially neglected, whereby the speed component of the object in the direction of the read out gradient magnetic field is correctly determined with one imaging.

9. An NMR imaging method according to claim 8, wherein the gradient magnetic field sequence includes a gradient magnetic field having a polarity opposite to the polarity of the read out gradient magnetic field and which is applied before applying a gradient field in the direction of the read out gradient magnetic field.

*10. A nuclear magnetic resonance (NMR) imaging method utilizing an NMR apparatus, comprising the steps of generating a magnetostatic field, a radio frequency (RF) magnetic field, and gradient magnetic fields including a slice selection gradient magnetic field which is applied so that a change in phase rotation due to motion in a slice selection direction is cancelled and becomes substantially zero, the generated fields being applied to an object to be imaged; detecting by picking up at least one NMR signal from the object; and calculating including performing calculations for reconstruction of an image for the at least one signal thus detected.*

*11. An NMR imaging method according to claim 10, wherein the step of applying the slice selection gradient magnetic field includes applying the slice selection gradient magnetic field at a time of application of a 90° pulse and a 180° pulse.*

*12. An NMR imaging method according to claim 10, wherein the step of applying the slice selection gradient magnetic field includes applying the slice selection gradient magnetic field in different polarities at a time of application of a 90° pulse and a time of application of a 180° pulse.*

*13. An NMR imaging method according to claim 10, wherein the step of applying the slice selection gradient magnetic field includes applying the slice selection gradient magnetic field so that a change in phase rotation due to a motion of blood flow is cancelled and becomes substantially zero.*

*14. A nuclear magnetic resonance NMR imaging method utilizing an NMR apparatus, comprising the steps of generating a magnetostatic field, a radio frequency (RF) magnetic field, and gradient magnetic fields including a slice selection gradient magnetic field which is applied so that a change in phase rotation due to motion in a slice selection direction is cancelled and becomes substantially zero, the generated fields being applied to an object to be imaged; detecting by picking up at least one NMR signal from the object; removing a phase change due to direction of the apparatus; and calculating including performing calculations for reconstruction of an image for the at least one signal thus detected.*

*15. An NMR imaging method according to claim 14, wherein the step of applying the slice selection gradient magnetic field includes applying the slice selection gradient magnetic field at a time of application of a 90° pulse and a 180° pulse.*

*16. An NMR imaging method according to claim 14, wherein the step of applying the slice selection gradient magnetic field includes applying the slice selection gradient magnetic field in different polarities at a time of application of a 90° pulse and a time of application of a 180° pulse.*

*17. An NMR imaging method according to claim 14, wherein the step of applying the slice selection gradient magnetic field includes applying the slice selection gradient magnetic field so that a change in phase rotation due to a motion of blood flow is cancelled and becomes substantially zero.*

* * * * *